United States Patent
Lo et al.

(10) Patent No.: US 6,754,077 B2
(45) Date of Patent: Jun. 22, 2004

(54) HEAT DISSIPATING APPARATUS FOR CIRCUIT BOARDS

(75) Inventors: Chih-Ching Lo, Taipei (TW); Chen Ching Hung, Taipei (TW)

(73) Assignee: Abit Computer Corporation, Taipei (TW)

(*) Notice: Subject to any disclaimer, the term of this patent is extended or adjusted under 35 U.S.C. 154(b) by 0 days.

(21) Appl. No.: 10/428,844

(22) Filed: May 5, 2003

(65) Prior Publication Data

US 2004/0085731 A1 May 6, 2004

(30) Foreign Application Priority Data

Nov. 13, 2002 (TW) ..................................... 91218144 U

(51) Int. Cl.$^7$ ................................................ H05K 7/20

(52) U.S. Cl. ...................... 361/700; 361/695; 361/699; 361/719; 257/714; 257/715; 174/15.2; 165/80.4; 165/104.26

(58) Field of Search ................................ 361/695, 699, 361/700, 719; 257/714, 715; 174/15.2; 165/80.4, 104.26, 104.33

(56) References Cited

U.S. PATENT DOCUMENTS

| | | | | |
|---|---|---|---|---|
| 5,810,554 A | * | 9/1998 | Yokozawa et al. | 415/176 |
| 6,072,696 A | * | 6/2000 | Horii | 361/695 |
| 6,137,681 A | * | 10/2000 | Lu | 361/697 |
| 6,301,107 B1 | * | 10/2001 | Lev et al. | 361/687 |
| 6,351,382 B1 | * | 2/2002 | Nakanishi et al. | 361/700 |
| 6,373,700 B1 | * | 4/2002 | Wang | 361/698 |
| 6,407,921 B1 | * | 6/2002 | Nakamura et al. | 361/700 |
| 6,421,239 B1 | * | 7/2002 | Huang | 361/696 |
| 6,442,025 B2 | * | 8/2002 | Nakamura et al. | 361/695 |
| 2003/0081382 A1 | * | 5/2003 | Lin | 361/697 |

* cited by examiner

Primary Examiner—Boris Chérvinsky
(74) Attorney, Agent, or Firm—Birch, Stewart, Kolasch & Birch, LLP

(57) ABSTRACT

A heat dissipation apparatus for circuit boards includes a heat transfer plate, at least one heat transfer tube located on the heat transfer plate, a first radiator located on the heat transfer plate, a shell mounted onto the heat transfer plate, an airflow generator located in the shell, at least one latch member latching on the heat transfer plate, and a filter located on the shell. The heat dissipation apparatus is mounted onto a circuit board (such as, but not limited to, interface card, processor circuit board) for discharging heat generated by various elements to ensure stable operations of the elements.

17 Claims, 4 Drawing Sheets

HEAT DISSIPATING APPARATUS FOR CIRCUIT BOARDS

FIELD OF THE INVENTION

The present invention relates to a heat dissipating apparatus for circuit boards and particularly a heat dissipating apparatus mounted onto a circuit board (processor circuit board or interface card) for dispersing heat generated by the elements on the circuit board.

BACKGROUND OF THE INVENTION

In computer products, heat dissipation is a problem that often baffles users. The computers often malfunction or not able to operate due to overheating. Thus heat dissipation has become a critical issue most vendors are trying to resolve. Conventional heat dissipation apparatus include radiation sheets, air fans and heat transfer tubes. The radiation sheet usually has a plurality of metal fins located on one side thereof to reduce the temperature of computer devices. The commonly used one is a passive radiation sheet. It can generate convection or does not need additional airflow to disperse heat. The radiation sheet mainly aims at increasing the radiation area. While the radiation sheet can increase the radiation area, heat energy still has to be discharged by airflow in the surroundings. The air fan aims at improving heat discharge. In general, the air fan generates airflow to carry heat energy away from the radiation sheet. The heat transfer tube is an advanced technique adopted on electronic devices. It is made from pure oxygen-free copper tubes and copper meshes filled with pure water or acetone as working fluid. The fluid at the heat receiving end is vaporized to become vapor phase. The vapor flows in the hollow tube to a cooling end to be cooled and condensed to the fluid phase again. The condensate is seeped and returns to the heat receiving end through a capillary structure in the copper mesh to complete the heat absorption and discharge cycle. By means of the phase changes of the working fluid, a great amount of heat energy can be transferred by a small temperature difference. However, all the heat dissipation techniques mentioned above neglect to discharge heat energy outside the machine casing. As a result, the discharged heat energy still remains inside the machine casing, and heat dissipation is not very effective.

SUMMARY OF THE INVENTION

Therefore the primary object of the invention is to resolve the aforesaid disadvantages. The invention provides a heat dissipation apparatus mounting onto a circuit board and through an airflow generator to suck in clean and cool air from outside or within the computer casing and to discharge extra heat energy generated by the circuit board through an opening formed on a metal plate located at the rear side of the circuit board outside or in the computer casing so that heat generated by the circuit board won't be trapped inside the computer casing or the circuit board. As the clean and cool air is drawn from outside or inside the machine casing, operation temperature of the circuit board may be reduced and heat dissipation may be achieved effectively, and operation stability of the circuit board can be ensured and service life can be improved.

In order to achieve the foregoing object, the heat dissipation apparatus of the invention includes a heat transfer plate, at least one heat transfer tube located on the heat transfer plate, a first radiator located on the heat transfer plate, a shell mounted onto the heat transfer plate, an airflow generator located in the shell, at least one latch member latching on the heat transfer plate, and a filter located on the shell. The heat transfer plate absorbs thermal energy and transfers to the heat transfer tube. The heat transfer tube transfers the thermal energy to the first radiator. The airflow generator sucks in air to discharge heat to achieve the heat dissipation object.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
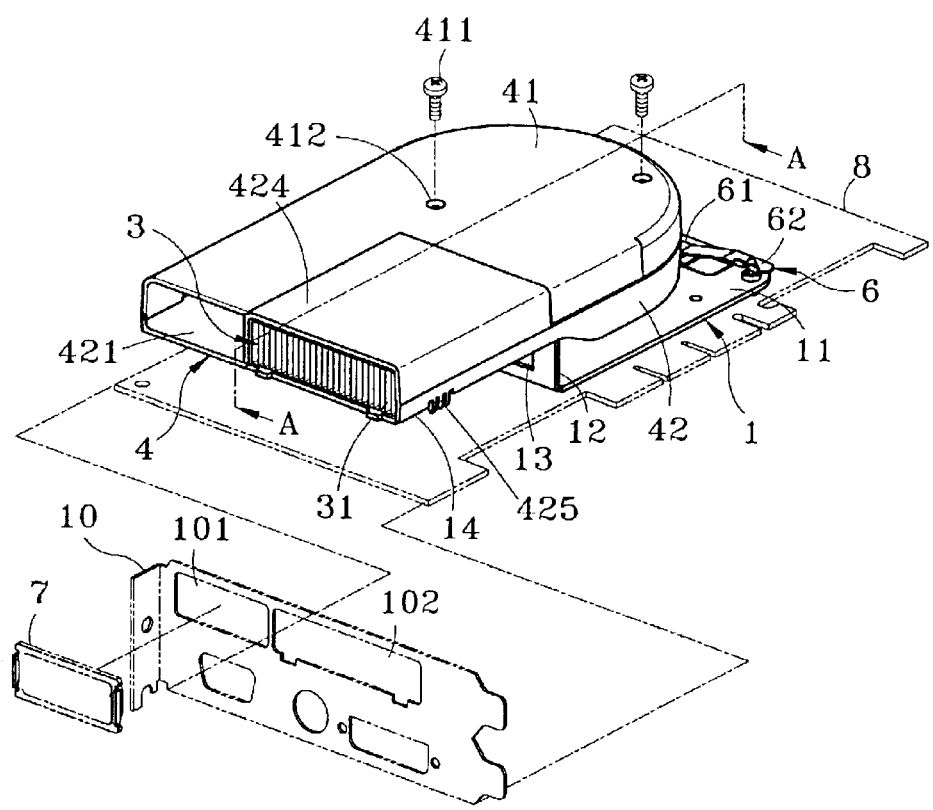
FIG. 1 is a perspective view of the heat dissipation apparatus of the invention.
Figure 2:
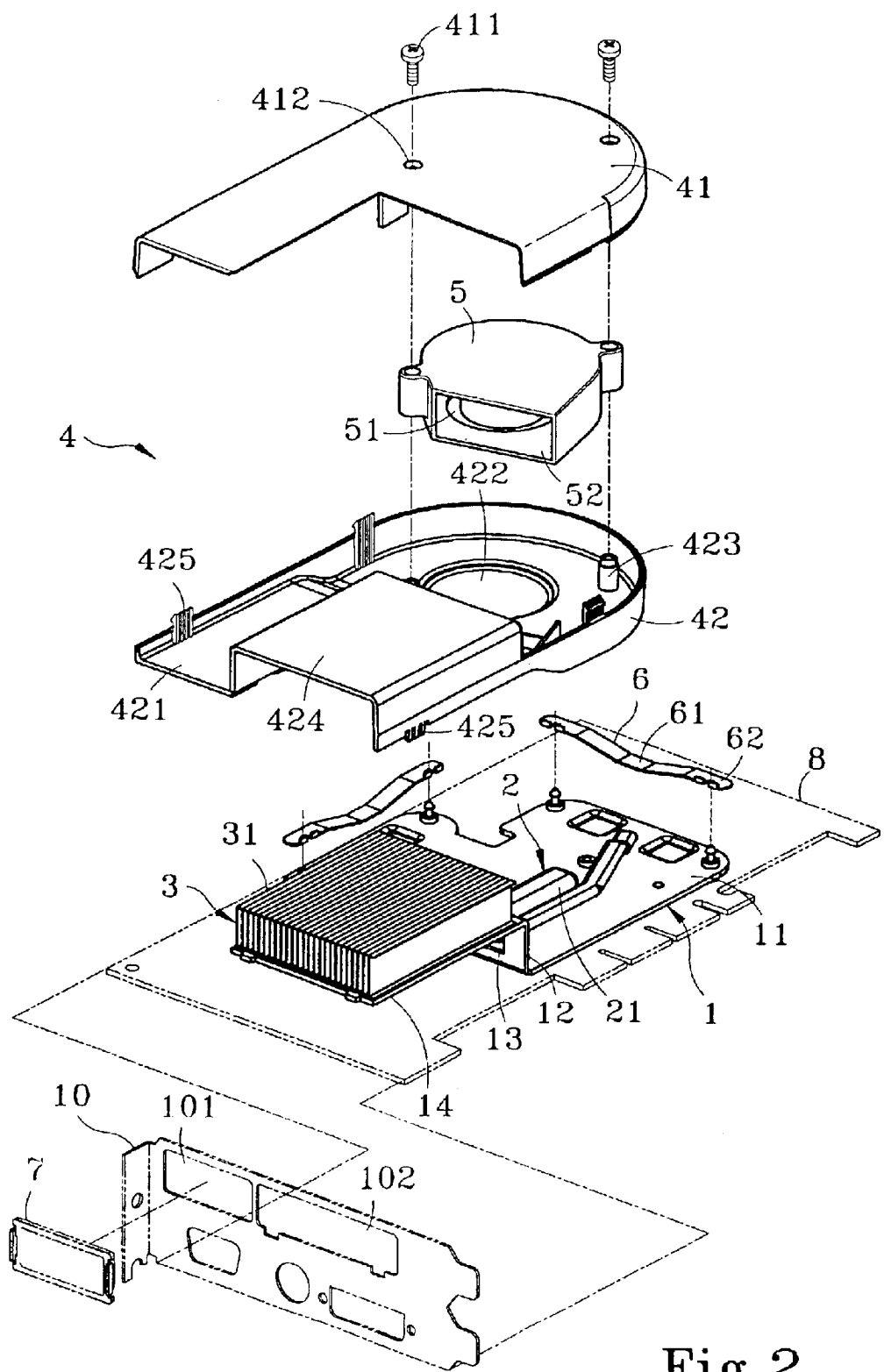
FIG. 2 is an exploded view of the invention according to FIG. 1.

Referring to FIGS. 1 and 2, the beat dissipation apparatus of the invention includes a heat transfer plate 1, at least one heat transfer tube 2 located on the heat transfer plate 1, a first radiator 3 located on the heat transfer plate 1, a shell 4 mounted onto the heat transfer plate 1, an airflow generator 5 located in the shell 4, at least one latch member 6 latching on the heat transfer plate 1, and a filter 7 located on the shell 4. The heat dissipation apparatus is mounted onto a circuit board (such as, but not limited to, interface card, processor circuit board) 8 for discharging heat generated by various elements to ensure stable operations of the elements.

The heat transfer plate 1 is made of metal, and has a contact section 11 to contact the circuit board 8 or elements (not shown in the drawings). The contact section 11 has one end connecting to an extended section 12 which has an opening 13. The extended section 12 connects to a loading section 14.

The heat transfer tube 2 which may be one or more located on the heat transfer plate 1. The technique of the heat transfer tube 2 is known in the prior art, thus details are omitted here. The heat transfer tube 2 has one end forming a heat receiving section 21 located on the contact section 11 and another end forming a cooling section 22 to run through the opening 13 and locate on the loading section 14. The heat transfer tube 2 is filled with working fluid inside (not shown in the drawings). When the heat receiving section 21 receives heat from the contact section 11, the working fluid in the heat receiving section 21 vaporizes to vapor phase. The vapor flows in the hollow tube of the heat transfer tune 2 to the cooling section 22 and to be cooled and condensed to liquid phase. The cooled working fluid flows back to the heat receiving section 21 through a capillary structure in the heat transfer tube 2, thus completes a heat absorption and discharging cycle.

The first radiator 3 is made from metal and is mounted onto the loading section 14. It has a plurality of first radiation fins 31 located thereon.

The shell 4 includes an upper half section 41 and a lower half section 42. The lower half section 42 has a flute 421 located on one side thereof to communicate with an opening 422 formed in the rear side of the lower half section 42. Adjacent to the periphery of the opening 422, there is an anchor section 423 for fastening to the airflow generator 5. On another side of the lower section 42 adjoining the flute 421, there is a protrusive section 424 to form a channel. The inner periphery of the lower section 42 and the protrusive section 424 have a plurality of fastening sections 425 for coupling with the upper half section 41 and the loading section 14. The upper half section 41 has an aperture 412 to receive a fastener 411 to fasten the airflow generator 5 to the anchor section 423.

The airflow generator 5 is a general radial fan which has an air inlet 51 corresponding to the opening 422. The airflow generator 5 has an air outlet 52 corresponding to the first radiator 3 and the channel formed by the protrusive section 424. After the airflow generator 5 is fastened to the anchor section 423, a gap is formed between the air flow generator 5 and the opening 422.

The latch member 6 is made of an elastic metal. It has a latch section 61 which has two free ends extending respectively to form a coupling section 62. When the heat transfer plate 1 is mounted onto the circuit board 8, the elastic pressure of the free ends of the latch section 61 can presses the heat transfer plate 1 securely onto the circuit board 8 to enable the elements on the circuit board 8 to form an effective contact with the heat transfer plate 1 for transferring heat generated by the elements to the heat transfer plate 1.

The filter 7 is an air purifier or a negative ion generator located on the inlet of the flute 421 for filtering the air entering into the shell 4.

Figure 3:
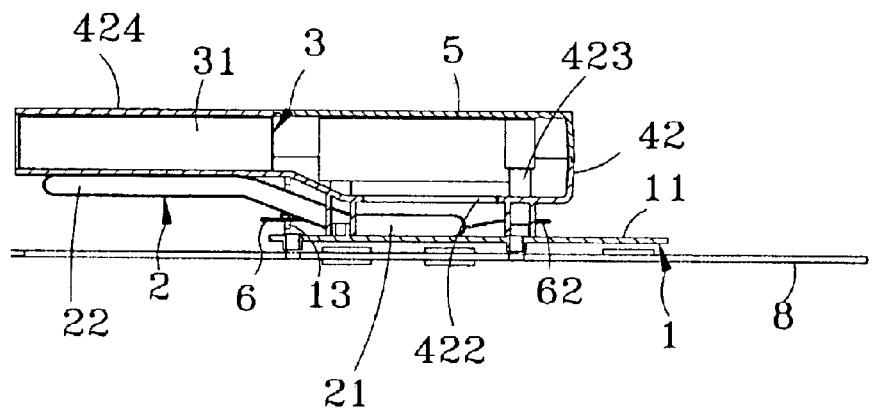
FIG. 3 is a cross section taken along line A—A in FIG. 1.

Referring to FIG. 3, for assembling the invention, make the heat receiving end 21 at one end of the heat transfer tube 2 in contact with the contact section 11 of the heat transfer plate 1; next, make the cooling section 21 at another end of the heat transfer plate 1 running through the opening 13 to contact another side of the loading section 14; then mount the first radiator 3 onto the loading section 14; thereafter fasten the airflow generator 5 in the shell 4, and fasten the shell 4 onto the heat transfer plate 1 with the protrusive section 424 covering the first radiator 3; finally, mount the filter 7 on the inlet of the shell 4 for filtering the entering air.

When mounting the heat dissipation apparatus onto the circuit board 8, press the latch member 6 on the heat transfer plate 1 to make the contact section 11 to be in contact with the circuit board 8 at the element location to enable the heat transfer plate to absorb heat generated by the elements.

Figure 4:
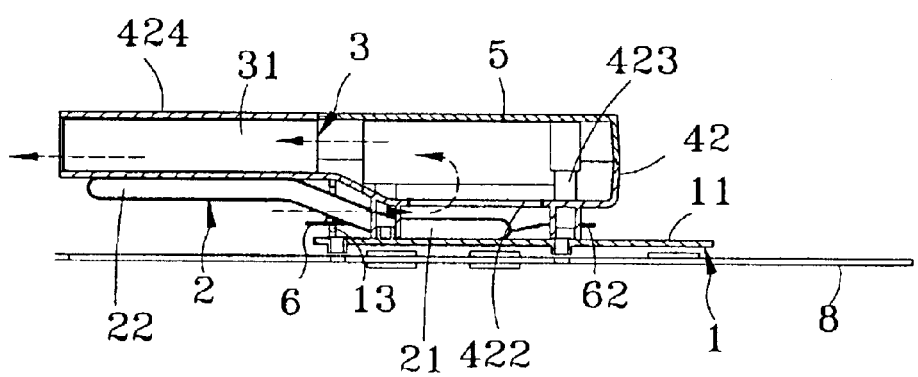
FIG. 4 is a schematic view of the airflow direction according to FIG. 3.
Figure 5:
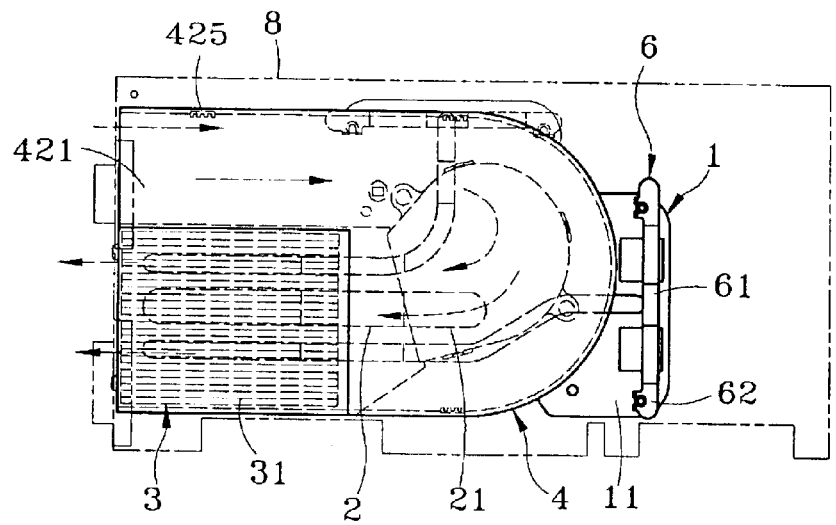
FIG. 5 is a schematic top view of the airflow direction according to FIG. 1.

Refer to FIGS. 4 and 5 for the airflow direction in the apparatus of the invention. When the heat dissipation apparatus is activated, the airflow generator 5 starts operating, air outside the shell 4 is drawn through the flute 421 and the opening 422 into the shell 4. While the air passing through the flute 421, impurities in the air are filtered out by the filter 7 so that the interior of the shell 4 and the first radiator 3 may be prevented from accumulating external impurities. In the mean time, heat absorbed by the contact section 11 of the heat transfer plate 1 is transferred to the heat receiving section 21 of the heat transfer tube 2. And the working fluid inside the heat receiving section 21 receives the heat and vaporizes to become vapor phase. The vapor flows in the hollow tube of the heat transfer tube 2 to the cooling section 22. The cooling section 22 transfers the received heat to the radiation fins 31 of the first radiator 3 through the loading section 14. The cooling section 22 cools and condenses the working fluid to liquid phase. Then the cooled working fluid flows back to the heat receiving section 21 through the capillary structure to complete one heat absorption and discharging cycle. Meanwhile, air sucked in by the airflow generator 5 flows to the channel of the protrusive section 424 formed by the first radiator 3 and the shell 4 to discharge heat generated by the circuit board 8. The process is repeatedly carried out to ensure that the elements on the circuit board 8 operating in a stable manner.

Figure 6:
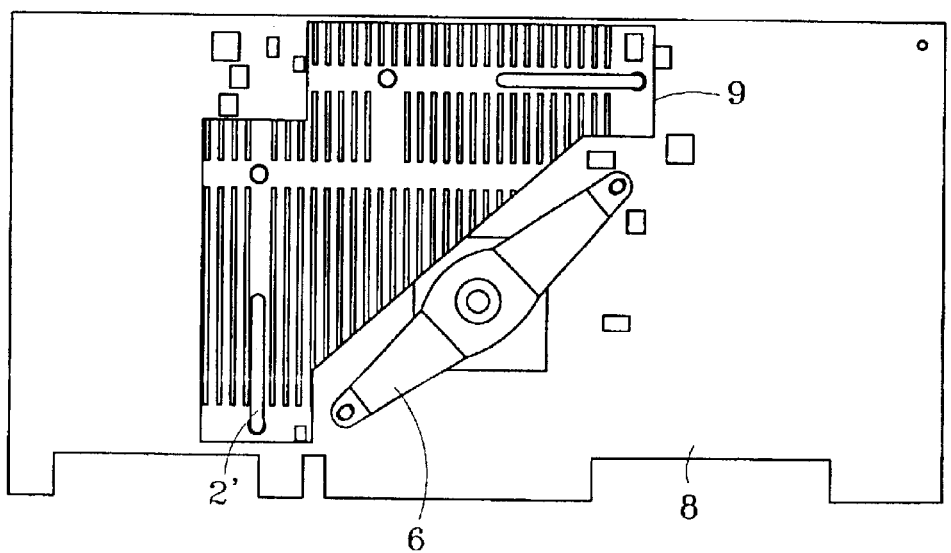
FIG. 6 is a schematic view of another embodiment of the invention.

Refer to FIG. 6 for another embodiment of the invention. There is another heat dissipation apparatus mounted onto another side of the circuit board 8. This heat dissipation apparatus includes a second radiator 9 coupling with a plurality of heat transfer tubes 2' to facilitate heat dissipation. Thus both sides of the circuit board 8 have heat dissipation effect.

In addition, the heat dissipation apparatus of the invention may also be mounted onto an interface card. The interface card may be fastened to a metal plate 10 on the computer casing (as shown in FIG. 1). The metal plate 10 must have an inlet 101 and an outlet 102 for sucking the air from outside the processor and discharging the exhaust air outside the processor.

Furthermore, the heat dissipation apparatus of the invention may also be installed on the main board inside the computer for directly sucking air in the interior of the processor and discharging the exhaust air in the processor. Then the exhaust air is discharged outside the processor by the original air fan installed in the processor.

What is claimed is:

1. A heat dissipating apparatus for circuit boards for dispersing heat generated by elements mounted onto a circuit board, comprising:
    a heat transfer plate located on the circuit board having a contact section which has one end connecting to an extended section, the extended section having an opening and connecting to a loading section;
    at least one heat transfer tube located on the heat transfer plate having one end formed a heat receiving section locating on the contact section and another end formed a cooling section running through the opening and locating on the loading section;
    a first radiator located on the loading section;
    a shell located on the heat transfer plate and the first radiator; and
    an airflow generator located in the shell;
    wherein the heat transfer plate absorbs heat and transfers the heat to the heat transfer tube which transfers the heat to the first radiator, the airflow generator sucking air to discharge the heat.

2. The heat dissipating apparatus for circuit boards of claim 1, wherein the heat transfer plate is made of metal.

3. The heat dissipating apparatus for circuit boards of claim 1, wherein the first radiator is made from metal and has a plurality of radiation fins located thereon.

4. The heat dissipating apparatus for circuit boards of claim 1, wherein the shell includes an upper half section and a lower half section.

5. The beat dissipating apparatus for circuit boards of claim 4, wherein the lower half section has a flute located on one side thereof communicating with an opening formed in a rear side of the lower half section, an anchor section adjacent to the periphery of the opening for fastening the airflow generator, a protrusive section to form a channel on another side of the lower section adjoining the flute, and a plurality of fastening sections located on the inner periphery of the lower section and the protrusive section for coupling with the upper half section and the loading section.

6. The heat dissipating apparatus for circuit boards of claim 4, wherein the upper half section has an aperture to receive a fastener.

7. The heat dissipating apparatus for circuit boards of claim 1, wherein the airflow generator is a general radial fan having an air inlet corresponding to the opening and an air outlet corresponding to the first radiator and the channel formed by the protrusive section.

8. The beat dissipating apparatus for circuit boards of claim 1, wherein the airflow generator and the opening of the shell form a gap therebetween.

9. The heat dissipating apparatus for circuit boards of claim 1 further having a latch member latched on the heat transfer plate.

10. The heat dissipating apparatus for circuit boards of claim 9, wherein the latch member is made of metal.

11. The heat dissipating apparatus for circuit boards of claim 9, wherein the latch member has a latch section which has two free ends each extending to form a coupling section.

12. The heat dissipating apparatus for circuit boards of claim 1 further having a filter located on the shell.

13. The heat dissipating apparatus for circuit boards of claim 12 wherein the filter is an air purifier or a negative ion generator.

14. The heat dissipating apparatus for circuit boards of claim 1, wherein the circuit board is selectively a processor circuit board or an interface card.

15. The heat dissipating apparatus for circuit boards of claim 1, wherein the circuit board has another side which has another set of the heat dissipating apparatus located thereon.

16. The heat dissipating apparatus for circuit boards of claim 1, wherein the heat dissipating apparatus includes a second radiator and at least one heat transfer tube.

17. The heat dissipating apparatus for circuit boards of claim 1, wherein the circuit board is an interface card fastening to a metal plate of a computer processor, the metal plate having an air inlet and an air outlet for directly sucking air from outside the processor and discharging the air outside the processor.

* * * * *